United States Patent [19]

Ceasar et al.

[11] 4,416,755

[45] Nov. 22, 1983

[54] APPARATUS AND METHOD FOR PRODUCING SEMICONDUCTING FILMS

[75] Inventors: Gerald P. Ceasar, Rochester; Scott F. Grimshaw, Fulton, both of N.Y.

[73] Assignee: Xerox Corporation, Stamford, Conn.

[21] Appl. No.: 254,341

[22] Filed: Apr. 3, 1981

[51] Int. Cl.³ .............................................. C23C 15/00
[52] U.S. Cl. ........................... 204/192 S; 204/192 N; 204/298
[58] Field of Search ............... 204/192 S, 192 N, 298; 136/258 AM

[56] References Cited

U.S. PATENT DOCUMENTS

| 4,046,666 | 9/1977 | McClanahan et al. | 204/298 |
| 4,213,844 | 7/1980 | Morimoto et al. | 204/298 |
| 4,217,374 | 8/1980 | Ovshinsky | 427/39 |

OTHER PUBLICATIONS

Thin Film Processes, Edited by John L. Vosseu et al, Academic Press, 1978, pp. 186, 187, 194.
G. P. Ceasar et al, Solid State Communications vol. 38, No. 2. Apr. 1981, pp. 89–93.
Ion Beam Coating Bulletin 52, 1977.
D. J. Sharp et al, J. Vac. Sci. Technol. 16 (6) Nov./Dec. 1979, pp. 1879–1882.
Alkaisi et al, "The Temperature Dependence of the Characteristics of Sputtered a-Si-H Solar Cells", Solar Cells 1 (1979/1980), p. 91.
Anderson et al, "Hydrogen Argon Pressure in the Preparation of rf-Sputtered Amorphous Silicon-Hydrogen Alloys", J. Vac Si Technicol 16 (3) May/Jun. 1979, p. 906.
Ishii et al, "Electrical Properties of Oxygenated Amorphous Si Prepared by Ion–Beam Sputtering", Japanese J. Applied Physics, vol. 18 (1979), No. 7, p. 1395.
Martin et al, "Property Composition Relationships in Sputter-Deposited a-Si-H Alloys", Solar Energy Materials 2 (1979/1980), p. 143.
Shimada et al, "Compositional and Structural Properties of Amorphous $Si_xC_{1-x}$: H Alloys Prepared by Reactive Sputtering", Japanese Applied Physics 50 (8) Aug. 1979, p. 5530.
Stein et al, "Controlled Hydrogenation of Amorphous Silicon at Low Temperatures", Applied Physics Lett. 34 (9), May 1, 1979, p. 604.
Weissmantel et al, "Structure and Properties of Quasi--Amorphous Films Prepared by Ion Beam Techniques", Thin Solid Films 72 (1980), p. 19.
Westwood et al, "Fabrication of Optical Waveguides by Ion Beam Sputtering", J. Vac. Si. Technical, vol. 13, No. 1, Jan./Feb. 1976, p. 104.

*Primary Examiner*—L. Dewayne Rutledge
*Assistant Examiner*—S. Kastler

[57] ABSTRACT

Apparatus and method for producing semiconducting films on a substrate in a vacuum chamber comprising a plasma generator, means for directing and accelerating an ion beam from the plasma to a sputtering target also contained within the vacuum chamber. A shield means having a low sputtering efficiency compared to the sputtered target is placed in the vacuum chamber between stray ion beams and the vacuum chamber surface and any implements to intercept stray or deflected ion beams and thereby minimize sputtering of the vacuum chamber and implements by the plasma which in turn minimizes the material of which the vacuum chamber and implements are made being present as impurities in the newly formed film. In a preferred embodiment amorphous silicon films are prepared with a ion beam containing a reactive gas which passivates the dangling bonds in silicon film.

27 Claims, 4 Drawing Figures

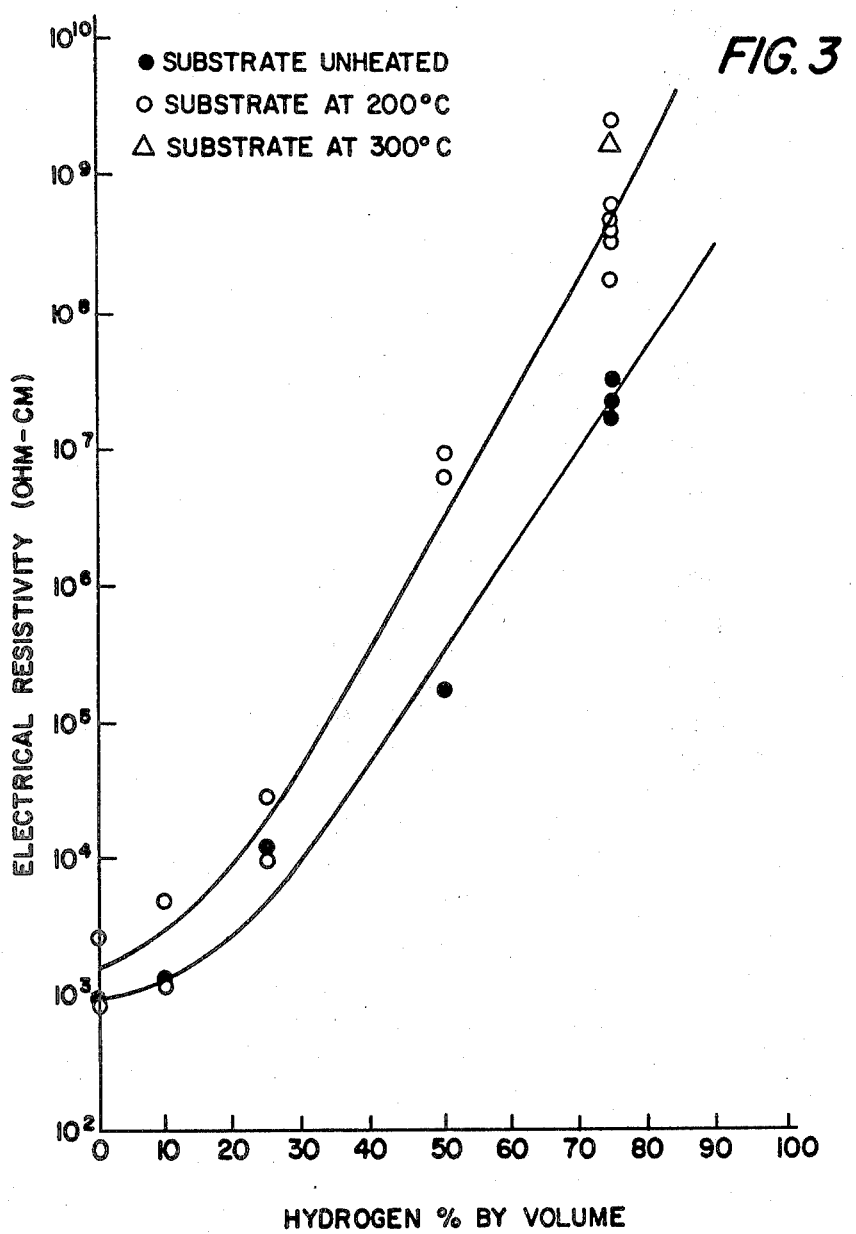

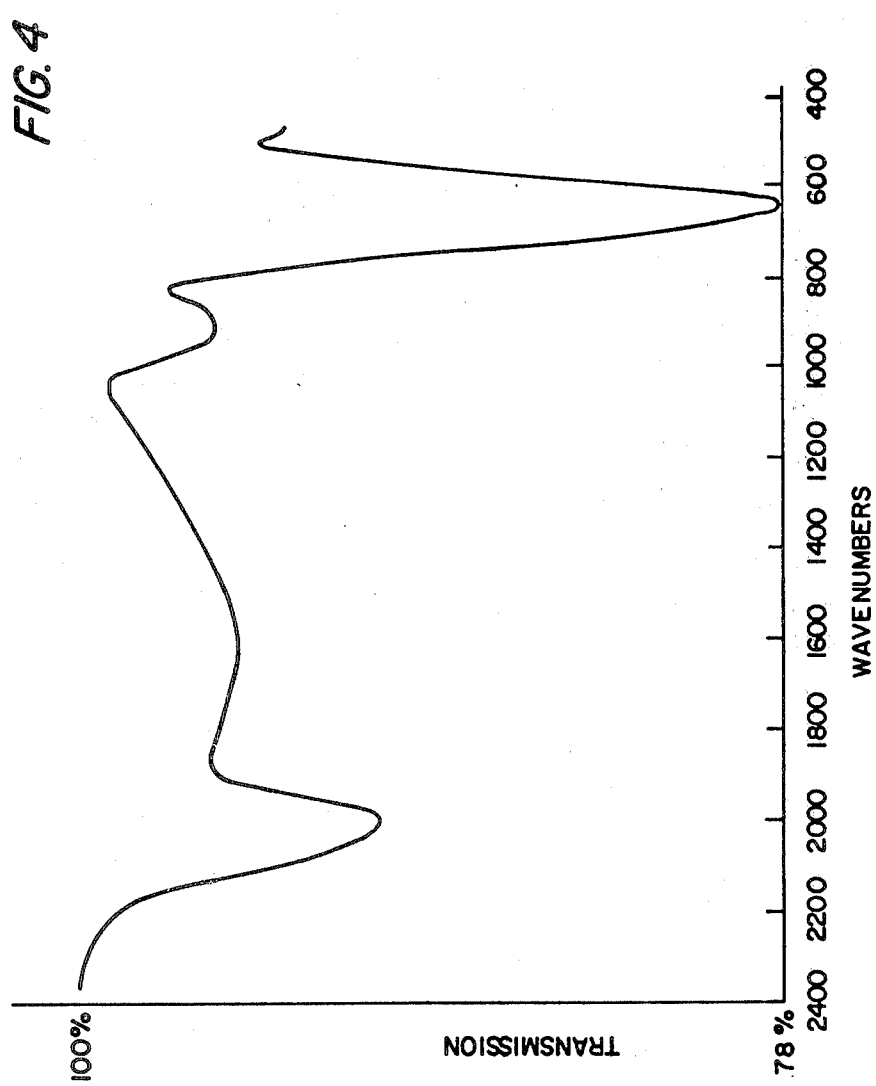

APPARATUS AND METHOD FOR PRODUCING SEMICONDUCTING FILMS

REFERENCE TO COPENDING APPLICATION

Reference is hereby made to copending application Ser. No. 254,342) entitled Method for Producing Semiconducting Films file concurrently herewithin the name of Gerald P. Ceasar and Scott F. Grimshaw.

BACKGROUND OF THE INVENTION

This invention relates to apparatus and methods for making semiconducting and photoelectronic devices and in general to a method and apparatus for coating a substrate with a semiconducing material. More specifically, the invention relates to the preparation of amorphous semiconductor films such as amorphous silicon.

Semiconductor films are of some significance today for use in a variety of industrial applications and are of particular interest for large area electronic applications such as solar cells, xerographic photoreceptors, thin film transistors, vidicons, etc. This interest is particularly high with respect to hydrogenated amorphous silicon films for several reasons. They have excellent photoelectric properties, high absorption coefficients through the visible region and are relatively low in cost. In addition, they can be manufactured in relatively large areas are non toxic, relatively hard and do not crystallize. Furthermore, they are ambipolar and can be xerographically charged either positively or negatively. They can also be doped to p or n type semiconductor to transport either positive or negative charge. In addition, they can be alloyed with other elements to provide material with tunable optical properties and which in particular are sensitive in the infrared region. With these properties they hold particular promise in the xerographic photoreceptor area as a potential replacement for selenium and selenium alloys. This is particularly true since they have the above superior properties and in addition are no more brittle than selenium.

This activity has been kindled by the discovery that the dangling bond defects intrinsic in the preparation of amorphous silicon can be reduced and to some extent controlled by choice of film deposition conditions. In pure amorphous silicon these dangling bonds are present in a density high enough to make films of this material unsuitable for many semiconductor and photoelectronic applications. The material, for example, cannot be successfully doped and made into p-n operation devices. These intrinsic dangling bonds furthermore serve as recombination sites making such films photoelectronically useless. In addition, the presence of impurities which introduce states in the band gap also alters the electrical properties of the film. This is particularly noticeable with metallic impurities in the film which give rise to electrically active impurity states in the band gap. If these states are present in high density it becomes impossible to control the conductivity of these materials thereby making n or p type doping not feasible. It has been found that if the amorphous films are formed in certain ways with the presence of a reactive gas that the gas coordinates with he intrinsic dangling bond defects and thereby removes these localized states from the band gap. This is particularly true for silicon which has been found to be especially reactive with hydrogen gas. The two techniques that have been used in the prior art for this general procedure are glow discharge decomposition of silane and r.f. (radio frequency) or direct current sputtering with a reactive gas.

In the glow discharge chemical vapor deposition technique silane gas (Si $H_4$) is flowed between two electrodes, one of which has the substrate mounted on it. As power is applied to the substrate the silane is decomposed into reactive silicon hydrogen species which deposit as a solid film on both electrodes. The presence of hydrogen is important since it may coordinate with the dangling bonds in the silicon in part as the mono, di and trihydrides, and thereby serves to passivate the dangling bonds.

The r.f. or d.c. (direct current) sputtering technique the substrate is fastened to one of two electrodes and a target of silicon is placed on the other electrode. Both electrodes are connected to a high voltage power supply. A gas which may for example be a mixture of argon and hydrogen is introduced between the electrodes to provide a medium in which a glow discharge can be initiated and maintained. The glow discharge provides ions which strike the target and remove by momentum transfer mainly neutral target atoms which condense as a thin film on the substrate electrode. The glow discharge also serves to activate the hydrogen causing it to react with the silicon and be incorporated in the deposited silicon film. The hydrogen coordinates with the dangling bonds in the silicon to form mono, di and trihydrides.

Difficulties are encountered with both of these prior art techniques principally because control over the several process parameters and thereby of the plasma energy involved cannot be achieved in either of the techniques. Particularly difficult is the reproduceability of accurate control of the discharge plasma since the floating potential of the discharge plasma cannot be readily accurately measured or controlled. Further glow discharge processes are complex and depend critically on a large number of process parameters. A glow discharge consists of a multiplicity of reactants, ions, free radicals, electrons and metastable excited species. These reactants may interact via a multiplicity of reaction pathways which may be initiated or propogated in either the gas phase or growing thin film surface. Furthermore, the surface of the reactor walls and the floating potential of the plasma exerts a well known but little understood influence on the plasma chemistry. These factors are moreover strongly affected by a number of critical deposition parameters including the r.f. power and frequency, flow rate, substrate temperature, pressure, concentration ratio of gases, gas flow pattern and reactor geometry. The large number of critical process parameters and their complex interrelationships makes these processes difficult to understand and control.

In both glow discharge or chemical vapor deposition and r-f-sputtering the film is formed in the presence of either the plasma or the sputtering process thereby increasing the probability of the plasma or the sputtering introducing defects in the film being formed since both the plasma and sputtering process are inherently high energy destructive processes. These process induced defects would arise from the bombardment of the thin film by the energetic species and radiation produced in the glow discharge including excited and ionized molecules and fragments, secondary electrons and photons. Furthermore, in both the glow discharge and r-f sputtering process the dangling bond sites of silicon, for example, may be coordinated with hydrogen as the mono, di and trihydride which is not desireable since the presence of the di and trihydride present in the film leads to undersirable photoelectric properties. In particular the photoconductivity is very poor. On the other hand it is desirable to have the hydrogen exist as the monohydride since it possesses excellent photoelectric properties. Furthermore, in the glow discharge processes, the possibility of microvoids being present in the film also exists which further leads to degradation of the electronic properties.

PRIOR ART

U.S. Pat. No. 4,213,844 to Morimoto et al is directed to an ion plating technique wherein the plating material is vaporized and wherein the substrate holder is an electrode. While it describes a "cluster ion beam" there is no reactive ion beam generated which sputters a target of the material from which the film is to be formed. Furthermore, there is no sputtering at all since it relies on a vaporization process.

U.S. Pat. No. 4,217,374 to Ovshinsky describes a method of making an amorphous semiconductor film by vaporizing silicon, condensing it on a substrate and preferably at the same time introducing two or three compensating or altering agents like activated hydrogen and fluorine in amounts which reduce the localized states in the energy gap.

Ishii et al "Electrical Properties of Oxygenated Amorphous Si Prepared by Ion-Beam Sputtering"; Japanese J. Applied Physics, Vol. 18 (1979), No. 7, pages 1395, 1396 describes a duoplasmatron type ion source for use in a sputtering operation where a target was sputtered with argon and $O_2$ was separately added to the chamber housing the substrate. There is no disclosure of sputtering with a reactive gas or more specifically with reactive hydrogen. In addition the duoplasmatron inherently produces a small beam focused to a very narrow degree and operates at relatively high energy levels. In view of this, the duoplasmatron technique is capable of use only in small area applications, less than about one square centimeter, and is not suitable for use in large area electronic applications.

SUMMARY OF THE INVENTION

In accordance with the present invention an improved apparatus and method for producing semiconductor films on a substrate is provided. In particular, the apparatus comprises a plasma generator, means for extracting and accelerating an ion beam from the plasma toward a target made from a material of which the film is to be formed. The target is maintained at reduced pressure in a vacuum chamber and is sputtered by the ion beam. The sputtered target material is collected as a thin film on a substrate which is physically isolated from the plasma generating and the sputtering process. A shield means having a low sputtering efficiency compared to the target is disposed in the vacuum chamber between stray ion beams and the vacuum chamber surface and any implements contained with the chamber. The presence of the shield minimizes any sputtering of the chamber walls and implements by the ion beam which thereby minimizes the impurities from the sputtered chamber and implements from being present in the newly formed film. In a preferred embodiment the shield is a thermally shocked carbon. In addition preferably a reactive gas is present in a mixture of same with an inert gas heavier than the reactive gas the reactive gas being present in an amount sufficient to passivate at least some of the dangling bonds formed in the sputtered material collected on said substrated.

In contrast to the relatively uncontrolled glow discharge or chemical vapor deposition and r-f sputtering techniques, ion beam deposition is a comparatively controlled method of thin film preparation providing precise control of deposition paramaters. In both chemical vapor deposition and r-f sputtering the deposition parameters and the actual deposition are relatively uncontrolled since the film is formed in the immediate presence of a rather violent, energetic plasma. Furthermore the gas flow patterns are critical. In r.f sputtering, the sputtering with attendent high substrate temperatures and the intermixing of film formation and the flow discharge can actually cause damage to the film being formed and as with chemical vapor deposition results in the incorporation of sputtered gas atoms in the film. One of the most troublesome difficulties in both of these techniques is the control and incorporation of impurities and defects in the film thereby deleteriously effecting the electrical properties of the film. This is manifested by, for example, the presence of dangling bond sites and in the case of amorphous silicon by the coordination of the dangling bonds as the mono, di and trihydrides. As described previously the di and trihydrides do not have good photoelectric properties.

Briefly, the type of thin film preparation according to the present invention involves generation of ions from an ion source using electron impact ionization and extraction and acceleration from this plasma of a focused monoenergetic beam of positive ions using a screen and acclerator grid electrodes. A monoenergetic beam is one where all ions strike the target with about the same energy with deviation of only a few electron volts. This enables greater control over the sputtering process. Control over beam energy from 0 to about 2000 ev with a spread of 1 to 2 ev is achieved by varying the bias voltage applied to the grid assembly. The grid assembly also serves as a radiation and mass barrier isolating the substrate from the plasma generating process. The vacuum in the deposition chamber is 1 to 2 orders of magnitude higher than in ion gun. The accelerated ion beam is directed from the ion gun at a target which is sputtered. Thin film formation occurs by collecting ejected target atoms onto a substrate which sits in a field free region of space essentially isolated from plasma generation and primary ion beam processes. With an ion beam flux greater than about 3 milliamps per square centimeter good film deposition rates are achieved.

In a particular application of the present invention semiconducting films of the elements of Group IV of the Periodic Table and in particular the hydrogen alloys of silicon, carbon and germanium are provided. These hydrogen alloys may be of the general formula $Si_x C_y Ge_z H_{(1-(x+y+z))}$ where x, y, and z are from 0 to 1. In a specific application of the ion beam deposition technique the ion beam is collimated providing a large diameter controlled beam which reduces the potentially extraneous sputtering away from the target. In addition with the thin film formation physically isolated from both the plasma generating process and the sputtering process the opportunity for damage to the growing thin film by these processes is virtually eliminated. In a particularly preferred application of the present invention an amorphous silicon film is formed on the substrate by sputtering a substantially pure crystalline silicon target with an ion beam containing an inert gas and reactive hydrogen. It is found with such a technique that the dangling bonds in the amorphous silicon are passivated and coordinated with hydrogen as the monohydride thereby providing good photoelectric properties.

Accordingly it is an object of the present invention to provide an improved method of an apparatus for making semiconducting films.

It is an additional object of the present invention to make amorphous semiconducting films having reduced dangling bond defects.

It is a further object of the present invention to make amorphous semiconducting films which have improved photoconductive properties.

It is an additional object of the present invention to make amorphous semiconducting films with few impurities.

It is an additional object of the present invention to form amorphous semiconducting films on an unheated substrate.

It is a further object of the present invention to provide semiconducting films free of defect states and with reduced microvoids and inhomogenieties.

It is an additional object of the present invention to provide an amorphous silicon film where the dangling bonds are coordinated with hydrogen as the monohydride.

It is an additional object of the present invention to provide apparatus for shielding the vacuum chamber from stray ion beams.

For a better understanding of the invention as well as other objects and further features thereof reference is had to the following drawings and descriptions.

BRIEF DESCRIPTION OF THE DRAWINGS

FIG. 3 is a graphical representation of the change in resistivity with hydrogen concentration in the reactive gas for substrates at ambient and elevated temperatures.

FIG. 4 is a graphical representation of the Fourier transform infrared spectra of a typical film prepared according to the present invention.

DESCRIPTION OF PREFERRED EMBODIMENT

Figure 1:
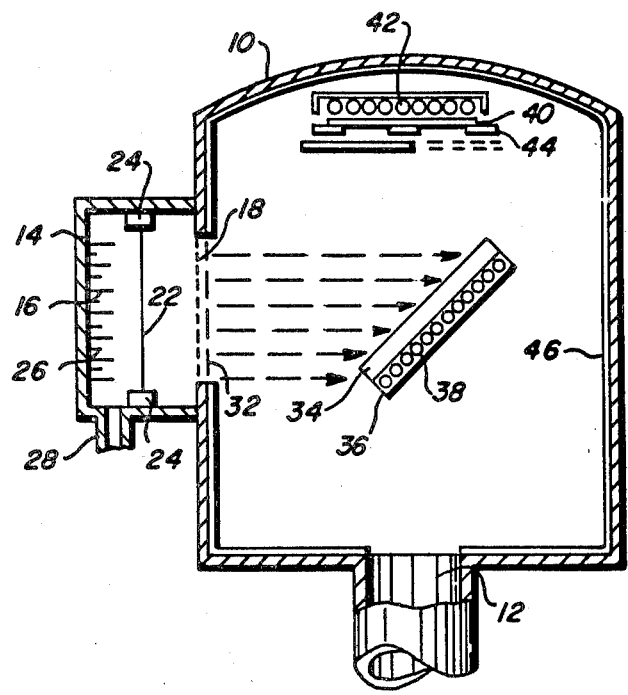
FIG. 1 is a schematic representation in cross-section of the apparatus that may be used to practice the present invention.
Figure 2:
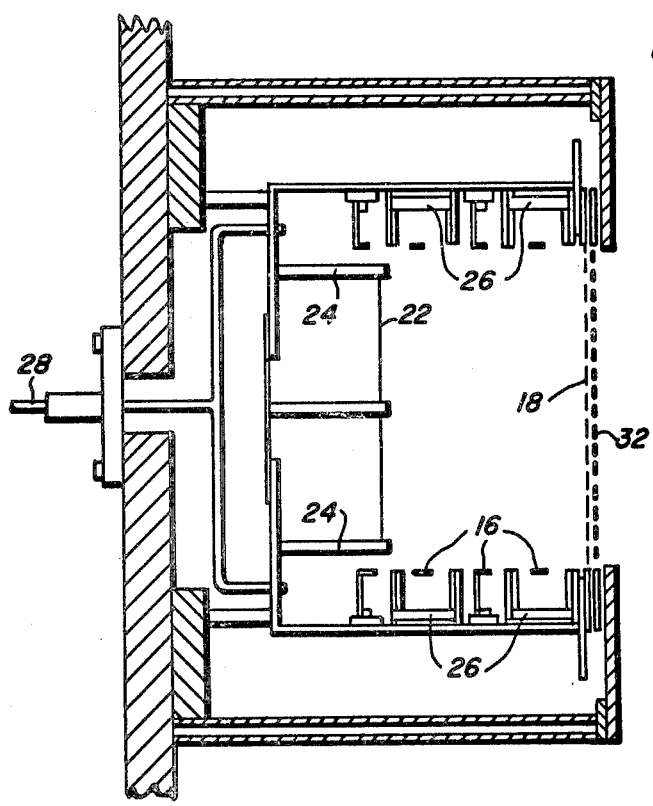
FIG. 2 is an enlarged schematic representation in cross-section of the ion gun that may be used to practice the present invention.

Referring now to FIG. 1 the method of the present invention will be described in greater detail with reference to the apparatus that can be used to perform it. The stainless steel vacuum chamber 10 is evacuated through conduit 12 by a pump (not shown) to provide a pressure in the chamber of from about $5 \times 10^{-9}$ Torr to about $10^{-3}$ Torr. The ion beam generated device or gun 14 which is a Kaufmann type ion source is attached to the vacuum chamber on a port flange and when the chamber is evacuated the pressure in the ion gun with gas flowing through it is from about $10^{-3}$ to $10^{-2}$ Torr. The Kaufmann type ion source may be more clearly seen with additional reference to FIG. 2. The ion gun comprises an anode 16, a screen grid 18 forming an end of the chamber and a cathode which comprises a wire filament 22 which is supported by end support 24. An array of permanent magnets 26 is placed behind the anode which produce a multipole field configuration across the anode and serves to keep electrons emitted by the cathode from traveling directly to the anode. The magnets serve to have the electrons execute a spiral pattern covering uniform excitement and therefore uniform plasma. With this type of field distribution electrons have free access to most of the chamber volume producing a very uniform beam. The reactive gas which may be a mixture of hydrogen and argon is introduced into the ion gun from the gas inlet 28. In front of the cathode is a screen grid 18 and ajdacent to it is an accelerating grid 32 each of which has small holes to act to give direction to the ions in the ion beam. In operation the cathode may be controlled independently of the anode with for example a cathode emission current of from about 10 to about 15 amperes which serves to give off electrons which ionize the reactive gas. The potential between the anode and the cathode filament is variable and of the order of from about 50 to about 2000 volts.

Both the cathode and anode are circular going around the ion gun chamber. During operation a relatively large potential difference exists between the anode and the cathode and electrons are boiled off the cathode which generate positive ions from electron bombardment of the reactive gas. The screen grid is baised positively at about the same potential as the anode and serves to condense or focus positive ions into small beams. Since it is biased negatively, the acceleration grid attracts positive ions and since the vacuum in the vacuum chamber is also attracting these ions, they are accelerated into the vacuum chamber. The net potential that the emitted positive ions are emitted at is the difference between the accelerator grid and the anode potential.

The screen 18 which is made of pyrolytic carbon has small holes of the order of 0.1 cm in diameter spaced in a uniform pattern. Adjacent the screen is the accelerator grid 32 which is also made of pyrolytic carbon and also has a uniform pattern of small holes, the holes being ofset slightly relatie to the holes in the screen. The screen is at or near positive anode potential, $(V_t)$ and serves to shape the positive ions into small beamlets which are accelerated by the negative potential $V_a$ of up to 500 volts on the accelerator grid. These beamlets emerge in the form of a composite ion beam with energy $V_t$-$V_a$. Control over beam energy which is of the order of several thousand electron volts is achieved by the voltages applied to the anode and accelerator grid. The grids also serve as a radiation and mass barrier screening the substrate from the plasma in the ion gun and keeping the vacuum in the main chamber at 1 to 2 orders of magnitude higher than that in the ion source.

The ion beam is in collimated form as it emerges from the grid and is directed to the target 34 which is supported on plate 36 the back of which is cooled to 20° C. to 30° C. by water running through coils 38. The target is mounted so that it is rotatable thereby providing different incidence angle to the ion beam. Typically however the target is positioned at the angle of maximum sputtering yield which is from about 30° to 45° to the ion beam.

When the ion beam strikes the target, the target is sputtered, and the sputtered target material is sprayed around the vacuum chamber with a large amount of the sputtered target coming to rest as a thin film on the substrate, which may be at ambient temperature or which may be elevated up to about 300° C. by the quartz lamps 42. If desired a mask 44 may be placed adjacent the substrate so that a pattern of the sputtered material may be defined on the substrate. The substrate may be of any suitable material. If elevated temperatures are desired the substrate must be capable of withstanding the temperature. Typically the substrate is flexible and is available in large sheets. Typical materials include such diverse materials as aluminum, quartz, stainless steel, glass, polyethylene, Teflon and Mylar.

The reactive gas introduced to the ion contains at least one gas which will be reactive during sputtering with the target material. Typical reactive gases include among other, hydrogen, fluorine, chlorine, nitrogen and oxygen. In a preferred embodiment hydrogen is used particularly where a film of amorphous silicon hydrogen alloy is desired. Where the reactive gas is relatively low in sputtering efficiency due to poor momentum transfer such as hydrogen, it can be mixed with an inert gas such as argon which serves to bombard the target with heavier atoms than the reactive gas thereby increasing the sputterin efficiency and film deposition rate of the process. Hydrogen for example, is a very light gas which upon striking a target tends to bounce off like a ping pong ball, whereas argon tends to strike the target with the force of a ball bearing. Typically the reactive gas is present in the gas mixture in an amount up to about 90 percent by volume.

While the process may be accomplished at elevated temperatures up to about 300° C., for example, a particular advantage is that it may be performed at ambient temperature where the substrate is at about 25° C. at the start of deposition and at about 60° C. or less at the conclusion of deposition. This has the advantage of enabling the use of a wide variety of substrates that are sensitive to temperature and thereby providing a new group of semiconducting materials.

The target may be made of any suitable material. It may, for example, be an amorphous, crystalline or polycrystalline material. Typically the Group IV elements such as silicon, germanium, carbon and mixtures thereof are suitable targets. A particularly preferred material is pure crystalline silicon which produces an amorphous silicon film on the substrate.

If desired the semiconductor film formed on the substrate may be doped to provide p and n type semiconductors. The doping may be accomplished by having a doped target in which the dopant is uniformly dispersed in the target material or by adding volatile dopants to the sputtering gas. Alternatively a split target of target material and dopant material may be used. Typical p type dopants include boron and typical n type dopants include, phosohorous, antimony and arsenic.

For optimum results in minimizing the presence or occurrence of impurities in the semiconducting film produced as a result of the sputtering process it is preferred to place a shield in the vacuum chamber between the stray ion beam and the vacuum chamber surface. Even with a collimated ion beam some small portion of the beam may not strike the target but rather may overshoot the target and sputter the stainless steel vacuum chamber. Further some of the ions in the ion beam striking the target may be deflected by the target and sputter the chamber walls. Furthermore, any other implements that may be present in the chamber may be sputtered if the ion beam strikes it. These sputterings are undesirable since they may provide a presence of impurities from the sputtered chamber or implements in the film being formed. To minimize this deleterious sputtering of the chamber a shield is placed behind and around the target in the path of stray ion beams before they strike the chamber walls. Typically this shield 46 protects the entire interior of the vacuum chamber as shown in FIG. 1. In addition, if any implements are present in the chamber they may be coated or shielded for the same purpose. The shield is typically made of a material that will not introduce electrically active band gap states in the film being deposited and that will have a low sputtering efficiency compared to the target. Carbon is an ideal shield material for silicon since it is a Group IV element and does not introduce electrically active states into the band gap of silicon. Typically the sputtering efficiency is an order of magnitude lower than the target material. For a 500 electron volt argon beam at 1 milliamp per square centimeter, silicon, germanium and carbon have sputtering efficiencies of 400, 900 and 40 angstroms per minute respectively. Under the same conditions the sputtering efficiency of stainless steel of which the chamber is made is 250 angstroms per minute. The shield material preferably has good operating properties in a vacuum, will withstand high temperature, will not vaporize and has low outgassing or low vapor pressure properties. A particularly satisfactory shield material is a thermally shocked graphitic form of carbon called "Stackfoil" which is marketed by the Stackpole Carbon Co., in Saint Mary's, Pa. This material which is an expanded form of graphite produced by heating graphite very quickly to temperatures over 1000° C. is 99.9% pure and is available in large flexible sheets which can be readily shaped to conform to a surface to be shielded from the stray ion beam.

EXAMPLES

A target which comprises a six inch slice of high purity, (greater than 99.9999% pure), undoped polycrystalline silicon is heat bonded to a copper bakcing plate. The ion gun is mounted on part of the high vacuum ($5 \times 10^{-9}$ Torr) stainless steel chamber which is pumped by a liquid nitrogen trapped diffusion pump. Prior to deposition the system is pumped down to $5 \times 10^{-7}$ Torr and during deposition a vacuum of $10^{-4}$ Torr is maintained. The target is sputtered with a reactive ion beam of argon and hydrogen of a high flux (3 milliamps per square centimeter or greater) produced from the ion gun. The hydrogen content in the reactive gas mixture of hydrogen and argon is varied up to about 90 percent volume and test runs are made as indicated in FIG. 3. The ion beam energy is 500 electron volts, the accelerartion voltage is 200V, the discharge voltage is 50 and the cathode current is about 12 amperes. Examples are prepared as a function of hydrogen concentration in the ion beam and substrate temperature and the results are graphically illustrated in FIG. 3. Deposition rates depend on the concentration of hydrogen in the ion beam and vary from about 3 micron per hour with essentially pure argon to about 0.6 microns per hour with 75 percent by volume hydrogen in the ion beam.

FIG. 3 illustrates the results of dark resistivity measurements. To make these measurements films are deposited on quartz substrates which contain a photolithographically printed pattern of 150 angstroms thick chromium electrodes arranged for four probe resistivity measurements. The geometry of the electrodes is chosen so that very linear currents and field profiles are obtained in a thin film. As illustrated in FIG. 3 the resistivity at any given deposition temperature varies dramatically with hydrogen concentration increasing over 6 to 7 order of magnitude from 0 to 75 percent by volume hydrogen in the reactive gas mixture. It can also be seen that increasing the substrate deposition temperature from room temperature to about 200° C. has a smaller effect on resistivity and that the single test at a substrate temperature of 300° C. shows very little improvement over the resistivity at 200° C.

From SIMS (Secondary Ion Mass Spectroscopy) which meausres hydrogen and impurity concentration and Fourier transform infrared spectroscopy hydrogen incorporation and bonding to silicon in the thin films which are produced is evident. For examples prepared with hydrogen ion beam SIMS data shows a strong peak at m/e=1 indicitive of hydrogen whereas this feature is absent in unhydrogenated films. The Fourier transform infrared spectra typical of the example is shown in FIG. 4. Excitation of vibrations characteristics of silicon-hydrogen bonding are evident in the 2000 cm$^{-1}$ and 630 cm$^{-1}$ peaks which are usually assigned to stretching and bending modes of Si—H. The peak at 2000 cm$^{-1}$ corresponds to the silicon hydrogen bond existing as the monohydride. The absence of any discrete peak at 2100 cm$^{-1}$ indicates that there is little, if any, multihydride or polysilane type of silicon-hydrogen coordination present in the films. This is important since as previously discussed the presence of multihydride is believed to deleteriously effect the electrical properties of the film.

From both X-ray and selected area electron diffraction characterization the structure of the films is determined to be amorphous. Chemical composition is checked using X-ray fluorescence spectroscopy and SIMS and no evidence of metallic impurities could be detected down to the detection limit of the analysis, 10 ppm. A hydrogenated film is alos examined using phase contrast transmission electron microscopy. No void network or any other structure is seen down to the resolution of the microscopy. This indicates that there are no unsatisfied bonds on internal film surfaces giving rise to localized band gap defects.

In summary ion beam deposition differes from r.f. sputtering and glow discharge deposition in that with ion beam deposition it is possible to more precisely control the deposition process. This comes about because of the use of an ion gun to generate the sputtering species and because ion generation, sputtering and thin film formation are completely independent. The employment of an ion gun permits independent control over the energy and current density of the bombarding ions. Collimation of the beam by the grids isolates the substrate from the ion beam minimizing the probability of process induced defects. With ion beam sources, deposition is doen at very low working gas pressures of the order of $10^{-4}$ to $10^{-5}$ Torr producing high purity thin films. Because ion generation sputtering and film formation are completely decoupled and the angle of incidence of the target to the ion beam and of the substrate to the sputtered species is completely variable maximum control over sputtering efficiency and thin film growth may be achieved.

In conclusion a new method and apparatus for preparing semiconducting films has been provided. The presence of a shield minimizes sputtering of the chamber walls which thereby minimizes the presence of impurities in the film being formed. In particular a new method of making amorphous semiconducting films of the Group IV elements by a reactive ion beam deposition is provided. Ion beam deposition with reactive gas such as hydrogen dramatically minimizes or eliminates the dangling bonds in the films which heretofore gave rise to defects in the band gap and sites for coordination with impurities. Ion beam deposition where the substrate is physically isolated from the plasma generating and primary sputtering process markedly reduces the possibility of impurities being present in the film. In a particular preferred embodiment amorphous silicon monohydride film with excellent photoelectrical properties is prepared.

While this invention has been described with reference to the specific embodiments disclosed it will be apparent to those skilled in the art that many alternatives, modification or variations may be made by those skilled in the art. It is intended to embrace all such alternatives and modifications as may fall within the spirit and scope of the appended claims.

We claim:

1. Apparatus for producing semiconducting films on a substrate comprising; a vacuum chamber, a plasma generator in communication with said vacuum chamber, means for extracting, accelerating and directing an ion beam from said plasma toward a sputtering target comprising said semiconductor material, said target being contained within said vacuum chamber, means to reduce the pressure within said vacuum chamber, shield means having a low sputtering efficiency compared to said sputtering target and being disposed in said vacuum chamber between stray ion beams and said vacuum chamber surface and any implements contained therein whereby sputtering of said vacuum chamber surface and or said implements by said plasma is minimized.

2. The apparatus of claim 1 wherein said target and said semiconducting film comprise the same element or elements from Group IV, of the Periodic Table.

3. The apparatus of claim 1 wherein said shield is flexible.

4. The apparatus of claim 3 wherein said shield is made of carbon.

5. The apparatus of claim 4 wherein said carbon is a thermally shocked carbon.

6. The apparatus of claim 3 wherein said shield withstands high temperature and has low outgassing properties.

7. The method of producing semiconducting films on a substrate comprising generating a plasma, extracting, accelerating and directing an ion beam of said plasma toward a sputtering target comprising said semiconductor, said target being contained within a vacuum chamber at reduced pressure, sputtering said target with said ion beam to sputter the target material, shielding said vacuum chamber surface from stray ion beams whereby sputtering of said vacuum chamber surface by said plasma is minimized, collecting said sputtered target material as a film on said substrate, said substrate being physically isolated from the plasma generating process and the sputtering process.

8. The method of claim 7 including the additional step of shielding implements within the vacuum chamber from stray ion beams.

9. The method of claim 7 wherein said plasma comprises a reactive gas and an inert gas heavier than the reactive gas.

10. The method of claim 7 wherein said target and said semiconducting film comprise the same element or elements from Group IVa of the Periodic Table.

11. The method of claim 7 wherein said shield comprises a flexible form of carbon.

12. The method of claim 9 wherein said semiconducting film is amorphous silicon, said target material comprises substantially pure crystalline silicon and said reactive gas is hydrogen.

13. The method of claim 12 wherein said amorphous film of silicon has silicon atoms coordinated with hydrogen substantially completely as the monohydride.

14. The method of claim 7 wherein said ion beam is collimated.

15. The method of claim 7 wherein said shield comprises a thermally shocked carbon.

16. The method of claim 7 wherein said target material is amorphous, polycrystalline or crystalline material.

17. The method of claim 7 wherein the substrate is maintained at a temperature of from about 25° C. to about 300° C.

18. The method of claim 17 wherein the substrate is maintained at ambient temperature.

19. The method of claim 9 wherein said inert gas is argon.

20. The method of claim 9 wherein said reactive gas is present in an amount sufficient to passivate some of the dangling bonds formed in the sputtered material collected on said substrate.

21. The method of claim 9 wherein said reactive gas is hydrogen which is present in said plasma in an amount of up to about 90 percent by volume.

22. The method of claim 7 wherein said substrate is flexible.

23. The method of claim 12 wherein said amorphous silicon is deposited at a rate of from about 0.6 microns per hour to about 3.0 microns per hour.

24. The method of claim 7 wherein the pressure in the vacuum chamber during sputtering is from about $5 \times 10^{-9}$ Torr to about $10^{-3}$.

25. The method of producing semiconducting films on a substrate comprising generating a plasma of reactive gas, extracting, accelerating and directing an ion beam of said plasma toward a target of material of which the film is to be formed, said target being contained within a vacuum chamber at reduced pressure, sputtering said target with said reactive ion beam to sputter the target material, shielding said vacuum chamber surface from stray ion beams whereby sputtering of said vacuum chamber surface by said plasma is minimized, collecting said sputtered target material as a film on said substrate, said substrate being physically isolated from the plasma generating process and the sputtering process.

26. The method of claim 25 wherein said plasma comprises a reactive gas and an inert gas heavier than the reactive gas.

27. The method of claim 26 wherein said reactive gas is present in an amount sufficient to passivate some of the dangling bonds formed in the sputtered material collected on said substrate.

* * * * *